United States Patent [19]

Flatley et al.

[11] Patent Number: 4,658,495

[45] Date of Patent: Apr. 21, 1987

[54] METHOD OF FORMING A SEMICONDUCTOR STRUCTURE

[75] Inventors: Doris W. Flatley, Hillsboro Township, Somerset County; Alfred C. Ipri, Hopewell Township, Mercer County, both of N.J.

[73] Assignee: RCA Corporation, Princeton, N.J.

[21] Appl. No.: 856,278

[22] Filed: Apr. 28, 1986

[51] Int. Cl.⁴ .......................................... H01L 21/473
[52] U.S. Cl. ................... 29/571; 29/576 W; 29/576 E; 29/576 T; 156/668; 156/657; 156/643; 148/DIG. 150
[58] Field of Search ............... 156/643, 662, 668, 657, 156/643; 148/DIG. 150; 29/576 W, 576 E, 576 T, 571

[56] References Cited

U.S. PATENT DOCUMENTS

| | | | |
|---|---|---|---|
| 4,174,217 | 11/1979 | Flatley | 96/36.2 |
| 4,242,156 | 12/1980 | Peel | 148/175 |
| 4,545,852 | 10/1985 | Barton | 156/643 |
| 4,604,304 | 8/1986 | Faraone et al. | 427/255 |

Primary Examiner—Brian E. Hearn
Assistant Examiner—Beverly A. Pawlikowski
Attorney, Agent, or Firm—Birgit E. Morris; R. Hain Swope

[57] ABSTRACT

A method for forming a layer of silicon dioxide over a silicon island on an insulating surface wherein the layer on top of the island is thinner than on the sidewalls is disclosed. The silicon island is oxidized and a silicon layer is deposited thereover. A layer of planarizing material is deposited over the silicon layer. The planarizing layer is anisotropically etched until the surface of the silicon layer overlying the island is exposed. The silicon layer is in turn etched until the surface of the oxide layer overlying the island is exposed. The remaining planarizing material is removed and the remaining silicon layer is oxidized. The thickness of the gate oxide layer on top of the island may be controlled by again exposing the island surface and reoxidizing to a predetermined thickness. A conductive polycrystalline silicon electrode is deposited on the oxide-covered island. The disclosed method is particularly useful in the formation of MOSFETs.

16 Claims, 9 Drawing Figures

METHOD OF FORMING A SEMICONDUCTOR STRUCTURE

This invention pertains to a method for forming the gate dielectric of a silicon transistor on an insulating substrate. The present method is particularly applicable to the formation of a metal oxide semiconductor field effect transistor (MOSFET) on an insulating substrate.

BACKGROUND OF THE INVENTION

A silicon-on-insulator (SOI) integrated circuit typically includes a plurality of spaced, isolated islands of single-crystalline silicon on the surface of an insulator, e.g. a sapphire, substrate. Each island generally includes a MOSFET which has source and drain regions spaced by a channel region, a channel oxide layer over at least the channel region and a conductive gate on the oxide layer and over the channel region. The various MOSFETs are electrically connected to form a desired circuit, such as a complementary MOS (CMOS) integrated circuit. The MOSFETs are typically electrically connected, at least in part, by conductive interconnects of doped polycrystalline silicon which extend over the surface of the substrate between the various silicon islands.

The insulating material of the substrate for the fabrication of MOSFETs may be monocrystalline, e.g. sapphire, beryllia or spinel, or may be amorphous, e.g. quartz (glass). When the substrate insulating material is monocrystalline, the devices are generally referred to as SOS (silicon-on-sapphire) devices. Devices having an amorphous insulating substrate are generally referred to as poly-on-glass. These designations will be utilized herein.

In the fabrication of poly-on-glass or SOS devices, following the formation of one or more silicon islands on the substrate surface, a gate oxide is formed so as to selectively overlie a portion or portions of the silicon island(s). A conductive gate electrode, typically of doped polycrystalline silicon, is then formed over the gate oxide so as to be capacitively coupled to a portion of the underlying silicon island. A high quality device requires a high quality silicon dioxide dielectric. Such a dielectric is provided in copending U.S. patent application Ser. No. 793,312, METHOD OF FORMING AN IMPROVED GATE DIELECTRIC FOR A MOSFET ON AN INSULATING SUBSTRATE, A.C. Ipri, filed Oct. 31, 1985. While this method produces a superior gate dielectric, it is limited in that the oxide on the sidewalls of the silicon islands is of approximately the same thickness as that on the top of the islands. Ideally, the gate dielectric layer on the top of the islands should be relatively thin and that on the sides substantially thicker to protect the device and prevent breakdown. A method of forming such a structure is provided in accordance with this invention.

SUMMARY OF THE INVENTION

A method of forming a silicon dioxide layer on a silicon island on an insulating substrate wherein said layer is substantially thinner on the top of the island than on the sidewalls thereof is disclosed. There is provided an insulating substrate having disposed thereon one or more silicon islands. A thin layer of silicon dioxide is formed on the islands, suitably by thermal oxidation. A layer of silicon is deposited over the islands and the substrate adjacent thereto. A layer of a suitable planarizing material is deposited over the structure and anisotropically etched until the surface of the silicon layer on the islands is exposed. The silicon is etched until the surface of the silicon dioxide on the islands is exposed. The remaining planarizing material is removed and the remaining silicon is oxidized thereby forming a silicon dioxide layer substantially thicker on the sidewalls of the islands than on the top. A layer of conductive polycrystalline silicon is deposited over the structure to overlie at least a portion of the top surface of the islands.

DETAILED DESCRIPTION OF THE PREFERRED EMBODIMENTS

Figure 1:
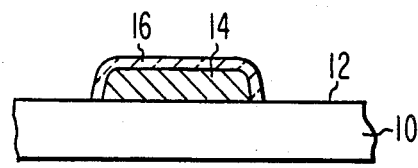
FIGS. 1–9 are sectional views illustrating in sequence the various steps in sequence of the present invention.

In FIG. 1, a silicon island 14 has been formed on a major surface 12 of a substrate 10. The substrate 10 is of an insulating material which may be monocrystalline, such as sapphire, beryllia or spinel, or amorphous, such as glass. The silicon island 14 is typically polycrystalline when the substrate 10 is amorphous and monocrystalline, although it may be polycrystalline, when the substrate 10 is monocrystalline. The silicon island 14 is formed by depositing a layer of silicon over the substrate 10 and lithographically defining it utilizing conventional techniques to form the island 14. The silicon island 14 is suitably from about 100 to 700 nm thick. The silicon island is then oxidized, suitably by thermal oxidation, to produce a layer of silicon dioxide 16 on all exposed surfaces thereof. The resultant layer of silicon dioxide 16 is suitably from about 10 to 40 nm, preferably from about 20 to 30 nm, thick.

Figure 2:
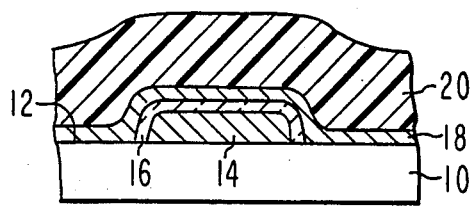

A layer of silicon 18 is conventionally deposited over the island and the substrate adjacent thereto as shown in FIG. 2. The silicon layer 18 is suitably deposited in the amorphous state, although it may be polycrystalline or substantially monocrystalline, if so desired. The silicon layer 18 is suitably deposited in the amorphous state from silane by low pressure chemical vapor deposition (LPCVD) at a temperature between about 560° and 528° C. to a thickness of between about 10 and 40 nm, suitably from about 20 to 30 nm.

A thick layer of a suitable planarizing material 20 is deposited over the structure as shown in FIG. 2. The planarizing material 20 is conventionally applied, preferably by spin-coating, and baked to enhance planarization and remove residual solvent. The planarizing material is typically a positive resist material such as HPR 206 of Philip A. Hunt Chemical Corp., AZ 1450J of The Shipley Company and the like. Other suitable organic planarizing materials include certain polyimides and poly(methylmethacrylate). Although the polyimides have a greater temperature processing latitude, the positive resist materials are generally preferred because of their superior planarizing capacity and, particularly, their purity. The thickness of the planarizing layer 20 is generally from about 1000 to 5000 nanometers, measured over the substrate.

Figure 3:
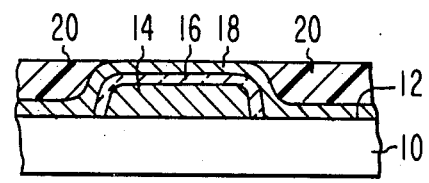
Figure 4:
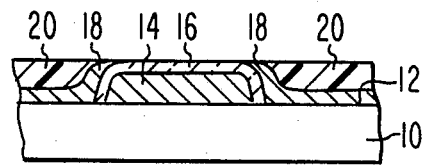

The planarizing layer 20 is anisotropically etched by conventional dry etching, e.g. reactive ion etching, to expose the surface of the silicon layer 18 overlying the island 14 as shown in FIG. 3. The etch mixture is then changed, if required, and etching of the silicon layer 18 is carried out until the silicon dioxide layer 16 overlying the island 14 is exposed as shown in FIG. 4. It will be appreciated that, if the planarizing layer 20 and the silicon layer 18 can be etched with the same etchant, only a single etch step is necessary. The remaining planarizing layer 20 is removed, suitably with an organic solvent. The exposed silicon is oxidized, e.g. by thermal oxidation, to form the structure shown in FIG. 5.

Figure 5:
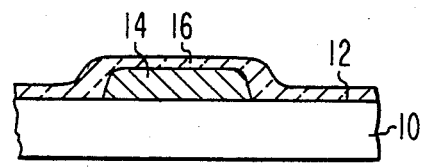

In the structure shown in FIG. 5, when the island 14 is 500 nm thick, the oxide layer 16 will typically be about 40 nm thick overlying the top of the island 14, from about 80 to 90 nm thick at the sidewalls of the island 14 and about 60 nm thick overlying the substrate 10 other than at the sidewalls of the island 14.

Figure 6:
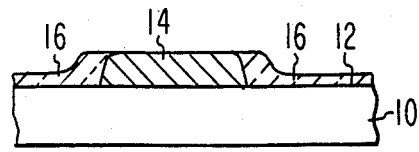

If desired, a thinner top layer of gate oxide can be formed on top of the islands 14 to a predetermined thickness by further processing the structure shown in FIG. 5. A layer of planarizing material is deposited over the oxide layer 16 and etched as described above until the oxide layer 16 overlying the top of the island 14 is exposed. The oxide layer is etched until the top surface of the island 14 is exposed as shown in FIG. 6. Any remaining planarizing material is removed and the surface of the island 14 is oxidized to grow the desired thickness of high quality gate oxide, typically about 20 nm.

Figure 7:
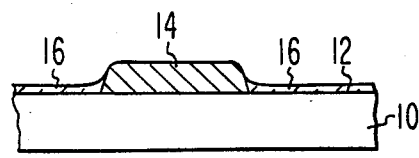
Figure 8:
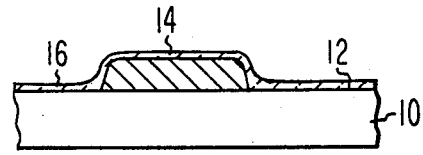

The thickness of the gate oxide layer 16 on the top of the island 14 can be controlled without the use of an additional planarizing layer by isotropically etching the silicon dioxide layer 16 of the structure shown in FIG. 5 until the surface of the island 14 is exposed. This etching step will likewise expose a portion of the sidewall surface of the island 14. As the oxide layer 16 is thinner on the top surface of the island 14 than on the substrate surface 12, a thin layer, i.e. about 10 to 30 nm, of oxide will remain on the substrate surface 12 as shown in FIG. 7. This residual layer of silicon dioxide is advantageous in that it protects the substrate, e.g. sapphire, against any damage from the etching process. The required thickness of gate oxide is then thermally grown on the exposed top and sidewall surfaces of island 14 as shown in FIG. 8.

Figure 9:
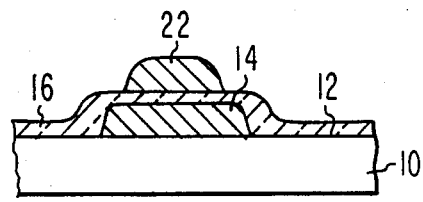

MOSFETs can be formed on the islands 14 using any standard technique. For example, a layer of conductive polycrystalline silicon is deposited over the structure shown in FIG. 5 or 8. The thin silicon dioxide layer 16 overlying the island 14 will form the channel dielectric of the device. The polycrystalline silicon layer may be made conductive by doping with an impurity such as phosphorus, suitably by adding a source of the impurity, e.g. phosphine, to the silane utilized to form the layer by LPCVD. The conductive polycrystalline silicon electrode is then conventionally, e.g. lithographically, defined to form strips 22 extending across portions of the islands 14 which are to be the channel regions of the MOSFETs as shown in FIG. 9. The strips of doped, conductive polycrystalline silicon 22, which serve as the gates of the MOSFETs, will extend over the silicon dioxide layer 16 from one island 14 to another to provide the desired connection between devices. Using the gate-forming strips of polycrystalline silicon 22 as a mask, ions of an appropriate conductivity type material are then implanted into the islands 14 on opposite sides of the gate strips 22 to form the source and drain regions of the MOSFETs. Additional strips of conductive material may then be formed on the device with the strips making ohmic contact with the source and drain regions formed in the islands 14 and extending over the silicon dioxide layers 16 to electrically connect the various MOSFETs in a desired circuit arrangement.

The method of this invention is advantageous in that it provides isolated islands on an insulator substrate having a thick protective oxide on the sidewalls where it is necessary to prevent or at least minimize the flow of electrons from the substrate to the polycrystalline silicon conductive lines. This is particularly important when the substrate is sapphire. The subject method at the same time provides a means for controlling the thickness of the gate oxide layer formed on top of the isolated islands so that a thin layer of oxide can be formed which is advantageous to the performance of a device such as a MOSFET formed in the islands and the circuit formed therefrom.

The invention has been described with reference to preferred embodiments thereof. It will be appreciated by those skilled in the art that various modifications may be made from the specific details given without departing from the spirit and scope of the invention.

We claim:

1. A method of forming a silicon dioxide layer on silicon islands on an insulating substrate comprising:
   (a) providing an insulating substrate having at least one silicon island disposed on a major surface thereof;
   (b) oxidizing the surface of the silicon island to form a layer of silicon dioxide thereover;
   (c) depositing a layer of silicon on the oxidized island and the substrate adjacent thereto;
   (d) depositing a layer of planarizing material over the substrate;
   (e) etching the planarizing layer for a time sufficient to expose the surface of the silicon layer overlying the island;
   (f) etching the silicon layer for a time sufficient to expose the layer of silicon dioxide on top of the island;
   (g) removing any remaining planarizing layer; and
   (h) oxidizing the remaining silicon layer.

2. A method in accordance with claim 1, additionally including the step of depositing a conductive polycrystalline silicon electrode on the oxidized silicon layer.

3. A method in accordance with claim 1, additionally including the steps of depositing a layer of planarizing material over the structure formed in set (h), etching the planarizing layer for a time sufficient to expose the layer of silicon dioxide overlying the island, etching the silicon dioxide layer for a time sufficient to expose the top of the island, removing any remaining planarizing layer, and oxidizing the top of the island for a time sufficient to form a layer of silicon dioxide of predetermined thickness thereon.

4. A method in accordance with claim 3, additionally including the step of depositing a conductive polycrystalline silicon electrode on said silicon dioxide layer of predetermined thickness.

5. A method in accordance with claim 1, wherein the insulating substrate is an amorphous material.

6. A method in accordance with claim 5, wherein the amorphous material is glass.

7. A method in accordance with claim 5, wherein the silicon island is polycrystalline.

8. A method in accordance with claim 5, wherein the silicon island is monocrystalline.

9. A method in accordance with claim 1, wherein the insulating substrate is a crystalline material.

10. A method in accordance with claim 9, wherein the crystalline material is selected from the group consisting of sapphire, spinel and beryllia.

11. A method in accordance with claim 10, wherein the crystalline material is sapphire.

12. A method in accordance with claim 10, wherein the silicon island is monocrystalline.

13. A method in accordance with claim 1, wherein, in step (c), the silicon layer is deposited in the amorphous state.

14. A method in accordance with claim 1, wherein the planarizing material is a positive resist material.

15. A method in accordance with claim 1, additionally including the steps of etching the silicon dioxide layer of the structure formed in step (h) for a time sufficient to expose the top surface of the island and oxidizing the exposed portion of the island to form a layer of silicon dioxide of predetermined thickness thereon.

16. A method in accordance with claim 15, additionally including the step of depositing a conductive polycrystalline silicon electrode on said silicon dioxide layer of predetermined thickness.

* * * * *

UNITED STATES PATENT AND TRADEMARK OFFICE
CERTIFICATE OF CORRECTION

PATENT NO. : 4,658,495

DATED : April 21, 1987

INVENTOR(S) : Doris W. Flatley et al.

It is certified that error appears in the above-identified patent and that said Letters Patent is hereby corrected as shown below:

Column 2, line 44, "528°C" should be --580°C--.

Column 3, line 46, "FIG." should be --FIGS.--.

Signed and Sealed this

Twenty-fifth Day of August, 1987

Attest:

DONALD J. QUIGG

*Attesting Officer*   *Commissioner of Patents and Trademarks*